US012813314B2

(12) United States Patent
Yun et al.

(10) Patent No.: US 12,813,314 B2
(45) Date of Patent: Nov. 24, 2026

(54) SEMICONDUCTOR PACKAGE

(71) Applicant: SAMSUNG ELECTRONICS CO., LTD., Suwon-si (KR)

(72) Inventors: Junghoo Yun, Suwon-si (KR); Jaemoon Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 339 days.

(21) Appl. No.: 18/385,611

(22) Filed: Oct. 31, 2023

(65) Prior Publication Data

US 2024/0145418 A1 May 2, 2024

(30) Foreign Application Priority Data

Nov. 1, 2022 (KR) ........................ 10-2022-0143954

(51) Int. Cl.
*H10W 72/20* (2026.01)
*H10W 70/60* (2026.01)
(Continued)

(52) U.S. Cl.
CPC ........... *H10W 72/20* (2026.01); *H10W 70/60* (2026.01); *H10W 70/652* (2026.01);
(Continued)

(58) Field of Classification Search
CPC ......... H10W 72/20–29; H10W 72/012–01271; H10W 72/072–07261; H10W 72/073–07355; H10W 72/30–387; H10W 72/851–889; H10W 72/90–987; H10W 70/60–699; H10W 20/40; H10W 74/10–15; H10W 74/137; H10W 71/012; H10W 90/701–798; H10W 99/00; H10W 90/721–7295; H10W 90/731–739
See application file for complete search history.

(56) References Cited

U.S. PATENT DOCUMENTS

| | | | |
|---|---|---|---|
| 6,642,626 | B2 | 11/2003 | Park |
| 6,677,677 | B2 | 1/2004 | Kimura et al. |

(Continued)

FOREIGN PATENT DOCUMENTS

| | | |
|---|---|---|
| KR | 10-2016-0004065 A | 1/2016 |

OTHER PUBLICATIONS

Communication dated Jun. 22, 2026 issued by the Korean Ministry of Intellectual Property in Korean Patent Application No. 10-2024-0020522.

*Primary Examiner* — Sue A Purvis
*Assistant Examiner* — Aneta B Cieslewicz
(74) *Attorney, Agent, or Firm* — Sughrue Mion, PLLC

(57) ABSTRACT

A semiconductor package includes a redistribution structure, a semiconductor chip on the redistribution structure, a conductive filler between the redistribution structure and the semiconductor chip and connecting the redistribution structure to the semiconductor chip, and a support post between the redistribution structure and the semiconductor chip, the support post being spaced apart from the conductive filler, where the support post includes a first post on a top surface of the redistribution structure, and a second post including a first end connected to the first post and a second end oriented toward the semiconductor chip and supporting the semiconductor chip.

20 Claims, 18 Drawing Sheets

(51) Int. Cl.

| | |
|---|---|
| ***H10W 70/652*** | (2026.01) |
| ***H10W 70/655*** | (2026.01) |
| ***H10W 70/685*** | (2026.01) |
| ***H10W 72/00*** | (2026.01) |
| ***H10W 72/30*** | (2026.01) |
| ***H10W 72/90*** | (2026.01) |
| ***H10W 74/01*** | (2026.01) |
| ***H10W 74/10*** | (2026.01) |
| ***H10W 74/15*** | (2026.01) |
| ***H10W 90/00*** | (2026.01) |
| ***H10W 99/00*** | (2026.01) |

(52) U.S. Cl.

CPC ... *H10W 70/655* (2026.01); *H10W 72/07252* (2026.01); *H10W 72/07253* (2026.01); *H10W 72/221* (2026.01); *H10W 72/234* (2026.01); *H10W 72/90* (2026.01); *H10W 74/012* (2026.01); *H10W 74/137* (2026.01); *H10W 90/701* (2026.01); *H10W 70/685* (2026.01); *H10W 72/012* (2026.01); *H10W 72/01235* (2026.01); *H10W 72/072* (2026.01); *H10W 72/07232* (2026.01); *H10W 72/07236* (2026.01); *H10W 72/073* (2026.01); *H10W 72/227* (2026.01); *H10W 72/241* (2026.01); *H10W 72/248* (2026.01); *H10W 72/252* (2026.01); *H10W 72/263* (2026.01); *H10W 72/267* (2026.01); *H10W 72/30* (2026.01); *H10W 72/354* (2026.01); *H10W 72/851* (2026.01); *H10W 74/15* (2026.01); *H10W 90/724* (2026.01); *H10W 90/734* (2026.01); *H10W 99/00* (2026.01)

(56) References Cited

U.S. PATENT DOCUMENTS

| | | | | |
|---|---|---|---|---|
| 7,667,473 | B1 * | 2/2010 | Conn | H10W 76/60 257/738 |
| 7,709,297 | B2 | 5/2010 | Haba et al. | |
| 8,279,618 | B2 | 10/2012 | Fukuda | |
| 8,872,335 | B2 | 10/2014 | Huebner et al. | |
| 2004/0036181 | A1 | 2/2004 | Hedler et al. | |
| 2005/0194695 | A1 * | 9/2005 | Lin | H10W 72/20 257/E21.705 |
| 2016/0005707 | A1 * | 1/2016 | Kwon | H10W 72/012 257/737 |
| 2018/0197826 | A1 | 7/2018 | Wu et al. | |
| 2021/0111125 | A1 * | 4/2021 | Chen | H10W 70/05 |
| 2021/0111126 | A1 * | 4/2021 | Lin | H10W 70/05 |

* cited by examiner

SEMICONDUCTOR PACKAGE

CROSS-REFERENCE TO RELATED APPLICATIONS

This application is based on and claims priority under 35 U.S.C. § 119 to Korean Patent Application No. 10-2022-0143954, filed on Nov. 1, 2022, in the Korean Intellectual Property Office, the disclosure of which is incorporated by reference herein in its entirety.

BACKGROUND

The present disclosure relates to a semiconductor package.

With the rapid development of the electronics industry and needs of users, electronic devices have become more compact, multi-functional, and large in capacity, and accordingly, highly integrated semiconductor chips are required. Accordingly, semiconductor packages having connection terminals with secured connection reliability have been devised for highly integrated semiconductor chips having an increased number of connection terminals for input/output (I/O), and for example, to prevent interference between the connection terminals, a fan-out semiconductor package with an increased gap between the connection terminals has been developed.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a semiconductor package that may reduce a void occurring in an underfill layer, reduce occurrence of a bonding failure of a semiconductor chip, and reduce stress occurring in the semiconductor chip, thereby improving productivity of the semiconductor package.

Additional aspects will be set forth in part in the description which follows and, in part, will be apparent from the description, or may be learned by practice of the presented embodiments.

According to an aspect of an example embodiment, a semiconductor package may include a redistribution structure, a semiconductor chip on the redistribution structure, a conductive filler between the redistribution structure and the semiconductor chip and connecting the redistribution structure to the semiconductor chip, and a support post between the redistribution structure and the semiconductor chip, the support post being spaced apart from the conductive filler, where the support post may include a first post on a top surface of the redistribution structure, and a second post including a first end connected to the first post and a second end oriented toward the semiconductor chip and supporting the semiconductor chip.

According to an aspect of an example embodiment, a semiconductor package may include a redistribution structure including a top surface and a connection pad on the top surface, a semiconductor chip on the redistribution structure, the semiconductor chip including a bottom surface and a passivation layer on the bottom surface, a conductive filler including a lower filler between the redistribution structure and the semiconductor chip, and connected to the connection pad, and a solder bump at one end of the lower filler and connecting the semiconductor chip to the lower filler, and a support post including a first post on the connection pad and between the redistribution structure and the semiconductor chip, the first post being separated from the conductive filler, and a second post including a first end connected to the first post and a second end oriented toward the semiconductor chip and supporting the semiconductor chip, where the second post may be insulated from the semiconductor chip by the passivation layer, where a first vertical length the first post may be equal to or greater than a second vertical length of the second post and where a perimeter of the second post that is within a perimeter of the top surface of the redistribution structure may be within a perimeter of the first post that is within the perimeter of the top surface of the redistribution structure.

According to an aspect of an example embodiment, a semiconductor package may include a redistribution structure including a top surface and a connection pad on the top surface, a semiconductor chip on the redistribution structure, the semiconductor chip including a bottom surface and a passivation layer on the bottom surface, a conductive filler including a lower filler between the redistribution structure and the semiconductor chip, and connected to the connection pad and a solder bump at one end of the lower filler and connecting the semiconductor chip to the lower filler, and a support post including a first post on the connection pad and between the redistribution structure and the semiconductor chip, the first post being separated from the conductive filler, and a second post including a first end connected to the first post and a second end oriented toward the semiconductor chip and supporting the semiconductor chip, where the second post may be insulated from the semiconductor chip by the passivation layer, where a ratio of a second vertical length of the second post to a first vertical length of the first post may be between about ⅕ and about ½, where a third vertical length the solder bump may be equal to the second vertical length, where a fourth vertical length the lower filler may be equal to the first vertical length, where a first horizontal width the first post may be equal to or greater than a second horizontal width of the second post, where a perimeter of the second post that is within a perimeter of the top surface of the redistribution structure may be within a perimeter of the first post that is within the perimeter the top surface of the redistribution structure, and where the first post and the lower filler may include the same material.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
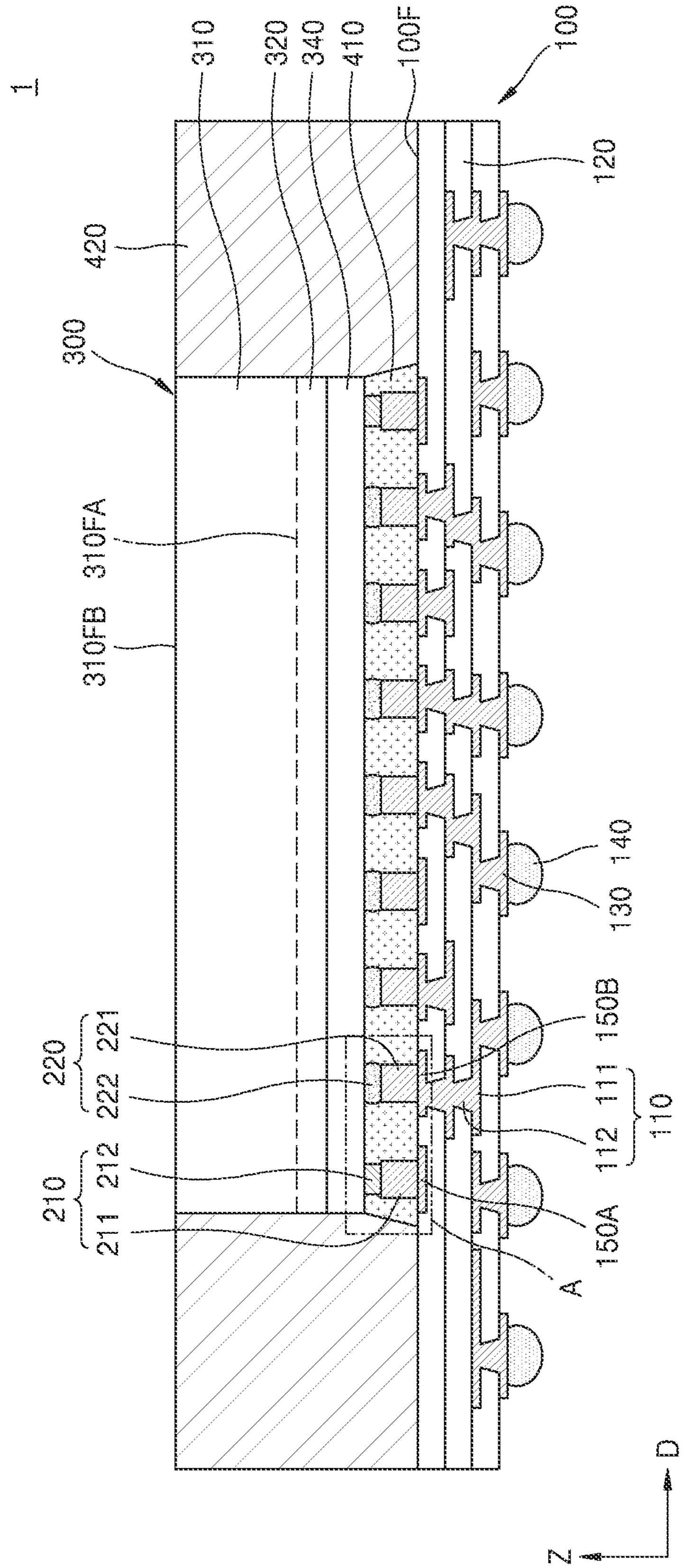
FIG. 1 is a cross-sectional view of a semiconductor package, according to embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a cross-sectional view of a semiconductor package 1, according to an embodiment.

Referring to FIG. 1, the semiconductor package 1 may include a redistribution structure 100 and at least one semiconductor chip 300 arranged on the redistribution structure 100. In some embodiments, the semiconductor package 1 may be a part of a lower package of a package-on-package (PoP). The semiconductor package 1 may be a fan-out type semiconductor package in which a horizontal width and a horizontal area of the redistribution structure 100 are greater than those of a footprint formed by at least one semiconductor chip 300. Herein, "horizontal" may refer to an X-Y plane in the drawing. In some embodiments, the semiconductor package 1 may be a fan-out type wafer level package (FOWLP) or a fan-out type panel level package (FOPLP).

In some embodiments, the redistribution structure 100 may be formed by a redistribution process. The redistribution structure 100 may be referred to as a wiring structure or a lower redistribution structure.

The redistribution structure 100 may include a redistribution insulation layer 120 and a plurality of redistribution patterns 110. The redistribution insulation layer 120 may surround the plurality of redistribution patterns 110. In some embodiments, the redistribution structure 100 may include a plurality of redistribution insulation layers 120 that are stacked. The redistribution insulation layer 120 may be formed from, for example, a photo imageable dielectric (PID) or a photosensitive polyimide (PSPI). For example, the redistribution structure 100 may have a thickness of about 30 μm to about 50 μm.

The plurality of redistribution patterns 110 may include a plurality of redistribution line patterns 111 and a plurality of redistribution via patterns 112. The plurality of redistribution patterns 110 may include, but are not limited to, metals such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc., or an alloy of the metals. In some embodiments, the plurality of redistribution patterns 110 may be formed by stacking metal or an alloy of metal on a seed layer including titanium, titanium nitride or titanium tungsten.

The plurality of redistribution line patterns 111 may be arranged on at least one of a top surface or a bottom surface of the redistribution insulation layer 120. For example, when the redistribution structure 100 includes the plurality of stacked redistribution insulation layers 120, the plurality of redistribution line patterns 111 may be arranged in at least some of on the top surface of the uppermost redistribution insulation layer 120, on the bottom surface of the lowermost redistribution insulation layer 120, and between two adjacent redistribution insulation layers 120 among the plurality of redistribution insulation layers 120.

The plurality of redistribution via patterns 112 may be connected to some of the plurality of redistribution line patterns 111 through at least one redistribution insulation layer 120. In some embodiments, the plurality of redistribution via patterns 112 may have a tapered shape extending with a horizontal width increasing from bottom to top. For example, the plurality of redistribution via patterns 112 may have a horizontal width increasing toward at least one semiconductor chip 300. Alternatively, the plurality of redistribution via patterns 112 may have a tapered shape extending with a horizontal width increasing from to top to bottom. For example, the plurality of redistribution via patterns 112 may have a horizontal width increasing away from the at least one semiconductor chip 300.

In some embodiments, at least some of the plurality of redistribution line patterns 111 may be formed with some of the plurality of redistribution via patterns 112 to form one body. For example, the redistribution line pattern 111 and the redistribution via pattern 112 contacting the bottom surface of the redistribution line pattern 111 may be formed together to form one body. For example, each of the plurality of redistribution via patterns 112 may have a horizontal width decreasing away from the redistribution line pattern 111 forming one body therewith.

Some of the plurality of redistribution patterns 110, which are arranged adjacent to the bottom surface of the redistribution structure 100, may be referred to as a plurality of lower connection pads 130, and some of the plurality of redistribution patterns 110, which are arranged adjacent to the top surface of the redistribution structure 100, may be referred to as a plurality of upper connection pads 150A and 150B. For example, the plurality of lower connection pads 130 may be some of the plurality of redistribution line patterns 111, which are arranged adjacent to the bottom surface of the redistribution structure 100, and the plurality of upper connection pads 150A and 150B may be some of the plurality of redistribution line patterns 111, which are arranged adjacent to the top surface of the redistribution structure 100.

A plurality of external connection terminals 140 may be attached to the plurality of lower connection pads 130. The plurality of external connection terminals 140 may connect the semiconductor package 1 to an outside. In some embodiments, each of the plurality of external connection terminals 140 may be a bump, a solder ball, etc. For example, the external connection terminal 140 may have a height of about 100 μm to about 180 μm. A plurality of support posts 210 may be connected to some of the plurality of upper connection pads 150A and 150B, and a plurality of conductive fillers 220 may be attached to others of the plurality of upper connection pads 150A and 150B.

The plurality of upper connection pads 150A and 150B may be arranged on a top surface 100F of the redistribution insulation layer 120. For example, when the redistribution structure 100 includes the plurality of stacked redistribution insulation layers 120, the plurality of upper connection pads 150A and 150B may be arranged on the top surface of the uppermost redistribution insulation layer 120.

Among the plurality of upper connection pads 150A and 150B, a plurality of first upper connection pads 150A may be or may not be electrically connected to the redistribution pattern 110. It is shown in FIG. 1 that the plurality of first upper connection pads 150A is not connected to the redistribution pattern 110.

Among the plurality of upper connection pads 150A and 150B, a plurality of second upper connection pads 150B may be electrically connected to the redistribution pattern 110. The plurality of second upper connection pads 150B may be connected to the redistribution pattern 110 to transmit an electric signal between the semiconductor chip 300 and the external connection terminal 140.

The at least one semiconductor chip 300 may be arranged on the redistribution structure 100. The semiconductor chip 300 may include a semiconductor substrate 310 having an active surface 310FA and an inactive surface 310FB that are opposite to each other, an front end of line (FEOL) layer 320 formed on the active surface 310FA of the semiconductor chip 300, a back end of line (BEOL) layer 340 provided under the FEOL layer 320, and a plurality of chip pads 360 arranged on a first surface of the semiconductor chip 300 to be described with reference to FIG. 3. For example, the semiconductor chip 300 may have a thickness of about 70 μm to about 200 μm.

Herein, the first surface of the semiconductor chip 300 and a second surface of the semiconductor chip 300 may be opposite to each other, and the second surface of the semiconductor chip 300 may refer to the inactive surface 310FB of the semiconductor substrate 310. The active surface 310FA of the semiconductor substrate 310 may be adjacent to (e.g., very close to) the first surface of the semiconductor chip 300.

In some embodiments, the semiconductor chip 300 may have face-down arrangement in which the first surface is directed toward the redistribution structure 100, and may be attached to the top surface 100F of the redistribution structure 100. In this case, the first surface of the semiconductor chip 300 may be referred to as a bottom surface of the semiconductor chip 300, and the second surface of the semiconductor chip 300 may be referred to as a top surface of the semiconductor chip 300. The top surface may refer to a surface oriented toward top in the drawing and the bottom surface may mean a surface oriented toward bottom in the drawing.

The semiconductor substrate 310 may include, for example, a semiconductor material such as silicon (Si) or germanium (Ge). Alternatively, the semiconductor substrate 310 may include a compound semiconductor material such as silicon carbide (SiC), gallium arsenide (GaAs), indium arsenide (InAs), and indium phosphide (InP). The semiconductor substrate 310 may include a conductive region (e.g., a well in which impurities are doped). The semiconductor substrate 310 may have various device isolation structures such as a shallow trench isolation (STI) structure.

On the active surface 310FA of the semiconductor substrate 310, a semiconductor device including various types of a plurality of individual devices may be formed. The plurality of individual devices may include various microelectronics devices, for example, a metal-oxide-semiconductor field effect transistor (MOSFET) such as a complementary metal-insulator-semiconductor (CMOS) transistor, a system large scale integration (LSI), an active device, a passive device, etc. The plurality of individual devices may be electrically connected to the conductive region of the semiconductor substrate 310. The semiconductor device may further include at least two of the plurality of individual devices or a conductive wire or a conductive plug that electrically connects the plurality of individual devices to the conductive region of the semiconductor substrate 310. The plurality of individual devices may be electrically separated from other adjacent individual devices by respective insulation films.

In some embodiments, the semiconductor chip 300 may include a logic device. For example, the semiconductor chip 300 may be a central processing unit (CPU) chip, a graphic processing unit (GPU) chip, or an application processor (AP) chip.

In some embodiments, when the semiconductor package 1 includes a plurality of semiconductor chips 300, at least one of the plurality of semiconductor chips 300 may include a CPU chip, a GPU chip, or an AP chip, and at least one other of the plurality of semiconductor chips 300 may include a memory semiconductor chip including a memory device. For example, the memory device may include a non-volatile memory device such as flash memory, phase-change random access memory (PRAM), magnetoresistive random access memory (MRAM), ferroelectric random access memory (FeRAM), or resistive random access memory (RRAM). The flash memory may include, for example, NAND flash memory or V-NAND flash memory. In some embodiments, the memory device may include volatile memory device such as dynamic random access memory (DRAM) or static random access memory (SRAM).

The support post 210 and the conductive filler 220 may be interposed between the semiconductor chip 300 and the plurality of upper connection pads 150A and 150B of the redistribution structure 100. The semiconductor chip 300 and the redistribution pattern 110 of the redistribution structure 100 may be electrically connected through the plurality of conductive fillers 220.

The conductive filler 220 may include a lower filler 221 and a solder bump 222. The lower filler 221 may be located on the first upper connection pad 150B. The lower filler 221 may be located on the first upper connection pad 150B and electrically connected to the first upper connection pad 150B. The lower filler 221 may transmit an electric signal between the semiconductor chip 300 and the external connection terminal 140.

The solder bump 222 may be located in the other end of the lower filler 221, which is opposite to an end of the lower filler 221 connected to the first upper connection pad 150B. The solder bump 222 may contact the lower filler 221. The solder bump 222 may be electrically connected to the lower filler 221 and contacting the lower filler 221. The chip pad 360 provided on the bottom surface of the semiconductor chip 300 described below and the solder bump 222 may contact each other. The chip pad 360 and the solder bump 222 may be electrically connected. The solder bump 222 may transmit an electric signal between the semiconductor chip 300 and the external connection terminal 140.

The lower filler 221 may include metal such as copper (Cu), titanium (Ti), aluminum (Al), nickel (Ni), tungsten (W), platinum (Pt), gold (Au), and/or an alloy thereof. The solder bump 222 may include metal such as tin (Sn), Cu, Al, silver (Ag), Au, and/or an alloy thereof.

The support post 210 may include a first post 211 located on the first upper connection pad 150A and a second post 212 having two ends, one of which may be connected to the first post 211 and the other of which may be oriented toward the semiconductor chip 300 to support the semiconductor chip 300.

The support post 210 may be connected to the first upper connection pad 150A. The second post 212 forming the support post 210 may contact the bottom surface of the semiconductor chip 300. The second post 212 may support the semiconductor chip 300 and contact the bottom surface of the semiconductor chip 300. The first post 211 may include metal such as Cu, Ti, Al, Ni, W, Pt, Au, and/or an alloy thereof. The second post 212 may include metal such as Cu, Ti, Al, Ni, W, Pt, Au, and/or an alloy thereof. The first post 211 and the second post 212 may include the same material. The first post 211 and the lower filler 221 may include the same material.

Shapes of the first post 211, the second post 212, and the conductive filler 220 will be described later in detail.

A molding layer 420 may surround the at least one semiconductor chip 300 on the top surface of the redistribution structure 100. For example, the molding layer 420 may cover at least a part of a side surface of the at least one semiconductor chip 300. For example, the molding layer 420 may have a thickness of about 150 μm to about 300 μm. The molding layer 420 may include a high molecular material. For example, the molding layer 420 may be a molding member including an epoxy mold compound (EMC). The molding layer 420 may include a filler. For example, the filler may include a ceramic-based material having non-conductive insulation characteristics. In some embodiments, the filler may include at least one of AlN, BN, Al2O3, SiC, or MgO. For example, the filler may be a silica filler or an alumina filler. For example, the molding layer 420 may include an epoxy-based material including a filler. An average diameter of the filler included in the molding layer 420 may be about 3 μm to about 50 μm. A rate of the filler included in the molding layer 420 may be about 60 wt % to about 90 wt %.

In some embodiments, an underfill layer 410 surrounding the plurality of support posts 210 and the plurality of conductive fillers 220 may be interposed between the semiconductor chip 300 and the redistribution structure 100. In some embodiments, the underfill layer 410 may cover a lower portion of the side surface of the at least one semiconductor chip 300 while filling a space between the at least one semiconductor chip 300 and the redistribution structure 100. The underfill layer 410 may include, for example, epoxy resin formed using, for example, a capillary underfill method. In some embodiments, the underfill layer 410 may be a non-conductive film (NCF).

In some embodiments, side surfaces of the redistribution structure 100 and side surfaces of the molding layer 420 may be arranged perpendicularly to each other. For example, a side surface of the redistribution structure 100 and a side surface of the molding layer 420 corresponding to each other may be coplanar to each other.

Figure 2A:
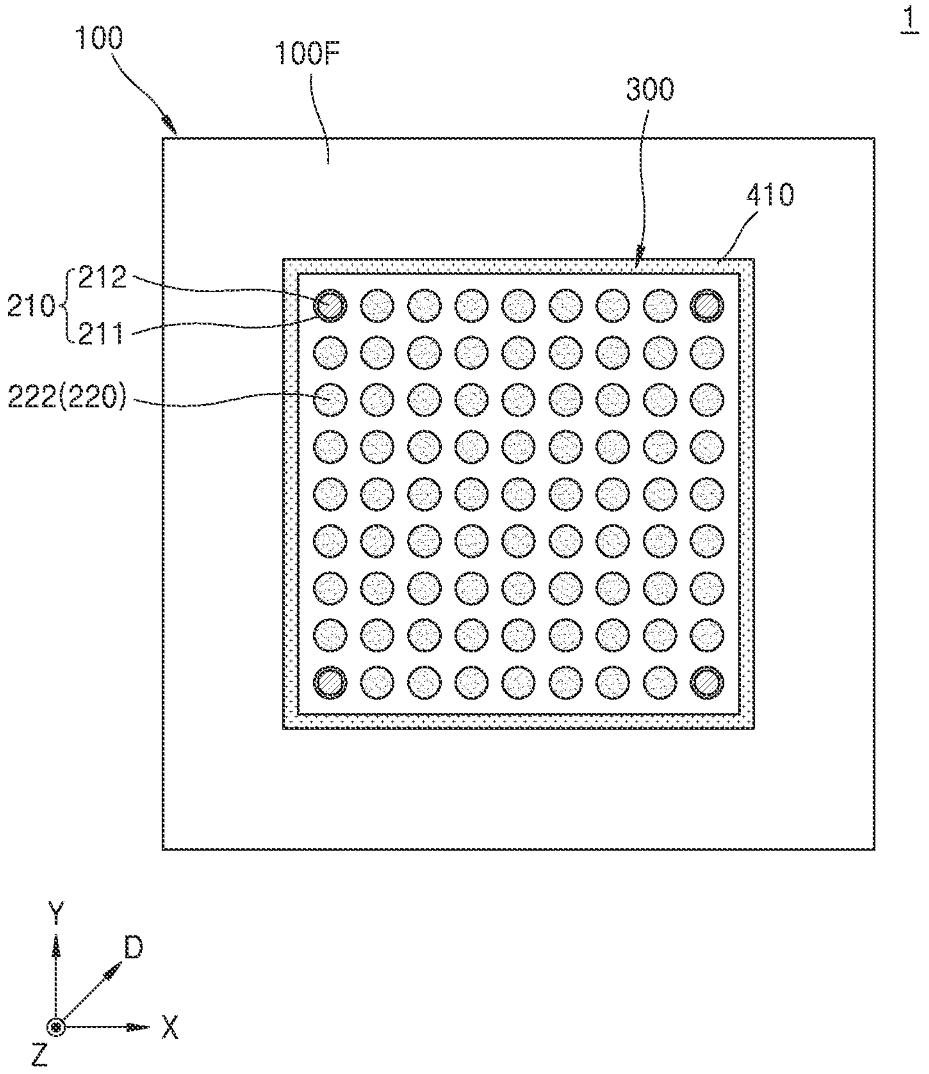
FIG. 2A is a diagram of a semiconductor package, according to an embodiment.

FIG. 2A is a diagram of the semiconductor package 1, according to an embodiment.

FIG. 2A is a plan view in which the semiconductor package 1 according to an embodiment is viewed down in a +Z-axis direction. FIG. 1 is a side cross-sectional view of the semiconductor package 1 diagonally cut in a first direction (a D-axis direction) with respect to the plan view of FIG. 2A.

As will be described later, a first width W1 of the first post 211 forming the support post 210 may be equal to or greater than a second width W2 of the second post 212 forming the support post 210. Thus, the first post 211 may be observed outside a circumference of the second post 212 with respect to the X-Y plane. It is shown in FIG. 2A that both the first post 211 and the second post 212 forming the support post 210 are shown as circular cross-sections, and the first post 211 and the second post 212 may be provided together as concentric circles. However, the shape of the support post 210 may not be limited as such.

The conductive filler 220 may include the lower filler 221 and the solder bump 222 as described above. In an example embodiment, a width of the solder bump 222 may be equal to or greater than a width of the lower filler 221. Thus, when observed from top with respect to the X-Y plane, the solder bump 222 may be observed as shown in FIG. 2A. However, the shape of the conductive filler 220 may not be limited as such.

The number of provided support posts 210 may be greater than the number of provided conductive fillers 220. The support post 210 may be located near the inner side of the perimeter of the semiconductor chip 300. As shown in FIG. 2A, the support post 210 may be located inside a vertex of the semiconductor chip 300 having a rectangular shape on the plane. In an example embodiment, the planar shape of the semiconductor chip 300 may be a rectangular shape, and the support post may be provided inside each vertex of the rectangular shape that is the planar shape of the semiconductor chip 300.

In a process of mounting a semiconductor chip on a redistribution structure, when the semiconductor chip and the redistribution structure are closer to each other by a width therebetween of a certain level or more, a void may occur in an underfill layer during formation of the underfill layer and short-circuit may occur due to connection between a bump and an adjacent bump during bonding of the semiconductor chip, resulting in process failures.

Due to a warpage occurring during bonding of the semiconductor chip to the redistribution structure by thermal compression bonding or a warpage inherent in the redistribution structure and the semiconductor chip, when the semiconductor chip is connected to the upper connection pad of the redistribution structure, a bump may not be wet with the pad to be connected, and thus process failures may occur in which the semiconductor chip and a part of the redistribution structure are not electrically connected.

In the semiconductor package 1 according to the disclosure, the semiconductor chip 300 may be supported by the support post 210 to form bonding of the semiconductor chip 300. Thus, the semiconductor chip 300 may be separated from the redistribution structure 100 with globally constant gaps from the redistribution structure 100. Due to the semiconductor chip 300 separated from the redistribution structure 100 with a constant gap therebetween, a void occurring in formation of the underfill layer may be reduced and short-circuit occurring in connection with an adjacent bump of the bump during bonding may be reduced. A process failure where the solder bump is not wet due to the semiconductor chip 300 separated with constant gaps therebetween and thus not being electrically connected may be reduced. Thus, a production yield of the semiconductor package may be improved by the semiconductor according to the disclosure.

The semiconductor package according to the disclosure may be electrically connected to the redistribution structure using the conductive filler, and unlike a general semiconductor package, may include the solder bump on the bottom surface of the semiconductor chip and the lower filler on the top surface of the redistribution structure. In a bonding process, the solder bump having soft physical characteristics may be bonded by being melted, such that stress occurring in the semiconductor chip due to different thermal expansion coefficients of the semiconductor chip and the redistribution structure may be reduced. In this way, the stress of the semiconductor chip occurring after bonding may be reduced.

Figure 2B:
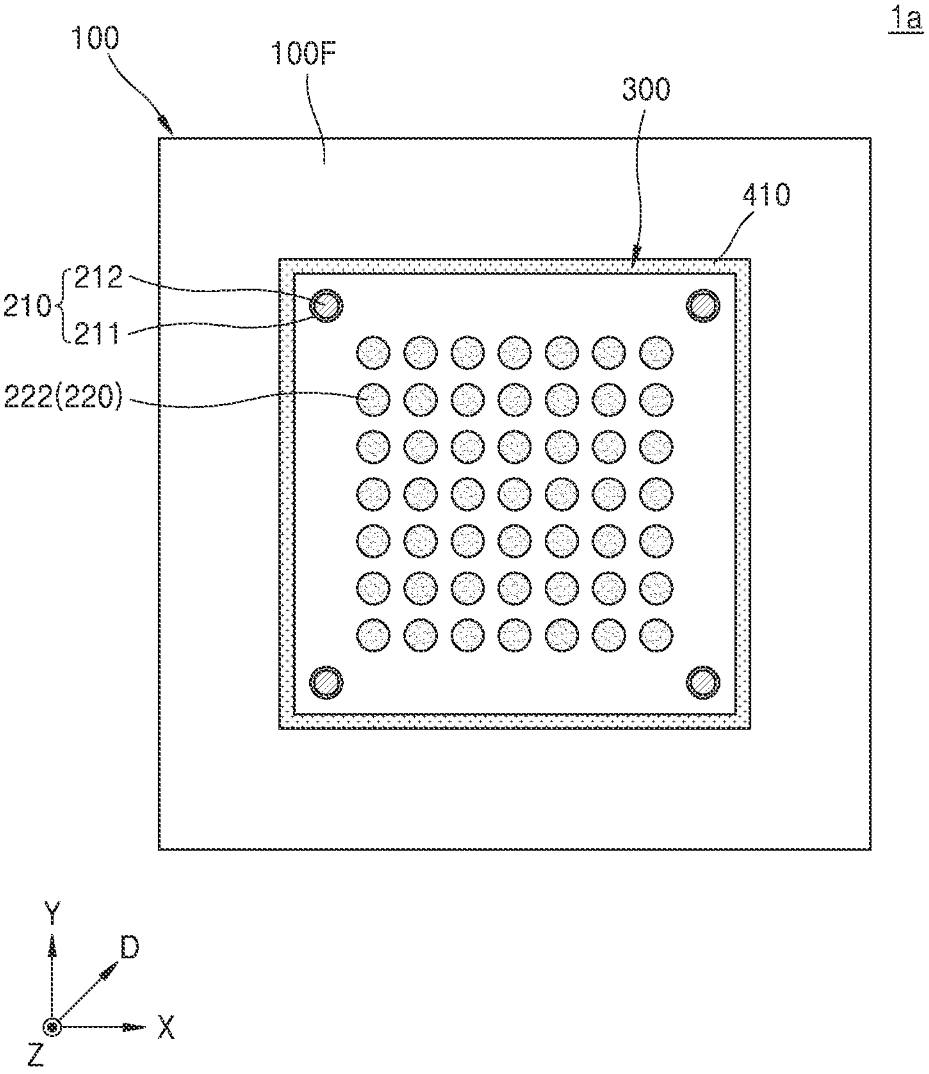
FIG. 2B is a diagram of a semiconductor package, according to an embodiment.

FIG. 2B is a diagram of a semiconductor package 1*a*, according to an embodiment. A description of repeated aspects corresponding to FIG. 2A may be omitted.

Referring to FIG. 2B, the support post 210 may be provided inside a vertex of a rectangular shape that is a planar shape of the semiconductor chip 300. The conductive filler 220 may not be arranged between each support post 210 and another support post 210 located in the X-axis and Y-axis directions. In other words, the conductive filler 220 may be located inside a shape formed by connecting positions where the support posts 210 are arranged.

Figure 3:
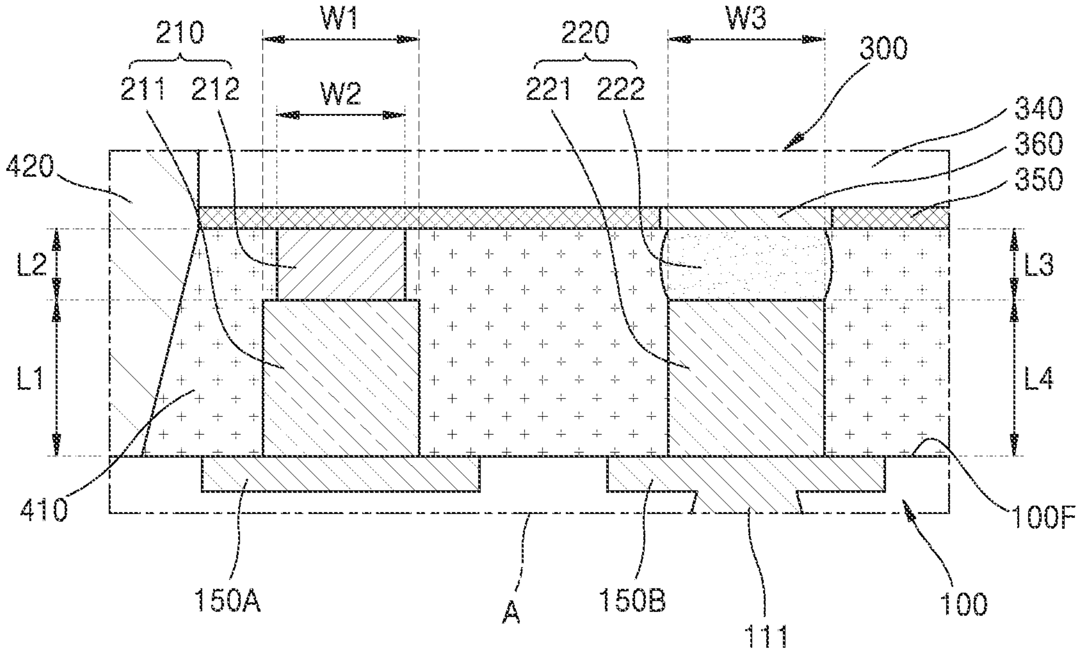
FIG. 3 is a diagram showing an enlarged view of a region A of FIG. 1 according to an embodiment.

FIG. 3 is a diagram showing an enlarged view of a region A of FIG. 1 according to an embodiment.

Referring to FIG. 3, the first upper connection pad 150A and the second upper connection pad 150B may be included in the redistribution structure 100. The support post 210 may be included in the first upper connection pad 150A, and the conductive filler 220 may be included in the second upper connection pad 150B. The second upper connection pad 150B may be electrically connected to the redistribution via pattern 112 included in the redistribution structure 100.

A passivation layer 350 may be formed on the bottom surface of the semiconductor chip 300 as shown in FIG. 3 to protect a semiconductor device included in the semiconductor chip 300. The chip pad 360 may be included in a part of the passivation layer 350. The chip pad 360 may be connected to a metal wire in the BEOL layer 340 so as to be electrically connected to the semiconductor chip 300.

The chip pad 360 may contact the solder bump 222 forming the conductive filler 220. The solder bump 222 may electrically connect the chip pad 360 to the lower filler 221. The semiconductor chip 300 may be electrically connected to the redistribution structure 100 through the chip pad 360, the solder bump 222, and the lower filler 221.

The first post 211 forming the support post 210 may contact the first upper connection pad 150A. The first upper connection pad 150A may not be electrically connected to the above-described redistribution pattern 110. Thus, the first post 211 may not serve to transmit an electric signal.

The second post 212 forming the support post 210 may be included in an upper end of the first post 211. One end of the first post 211 may contact the first upper connection pad 150A, and the second post 212 may contact the other end of the first post 211. A first end of the second post 212 located opposite to a second end of the second post 212 contacting the first post 211 may contact the passivation layer 350. The passivation layer 350 may include an insulation material, such that the support post 210 may not be electrically connected to the semiconductor chip 300.

A vertical length from a first end to a second end of the first post 211 may be referred to as a first length L1, a vertical length from a first end to a second end of the second post 212 may be referred to as a second length L2, a vertical length from a first end to a second end of the solder bump 222 may be referred to as a third length L3, and a length from a first end to a second end of the lower filler 221 may be referred to as a fourth length L4.

A horizontal width of the first post 211 may be referred to as a first width W1, a horizontal width of the second post 212 may be referred to as a second width W2, and a horizontal width of the lower filler 221 may be referred to as a third width W3.

The first length L1 may be equal to the fourth length L4. Herein, "equal" may indicate that they are equal within an error occurring in a process, taking the error into account. In a semiconductor package manufacturing process according to the disclosure described below, the first post 211 and the lower filler 221 are formed in the same process, such that the first length L1 and the fourth length L4 corresponding to respective vertical lengths may be equal to each other.

The second length L2 may be equal to the third length L3. A distance between the semiconductor chip 300 and the redistribution structure 100 may be constant. Thus, the first length L1 and the fourth length L4 are equal to each other, such that the second length L2 and the third length L3 may be equal to each other.

The first length L1 may be equal to or greater than the second length L2. In an example embodiment, the support post 210 may be provided such that a ratio of the second length L2 to the first length L1 may be less than or equal to about ½. For example, the support post 210 may be provided such that a ratio of the second length L2 to the first length L1 may be at least about ⅕ and no greater than about ½.

The fourth length L4 may be equal to or greater than the third length L3. In an example embodiment, the conductive filler 220 may be provided such that a ratio of the third length L3 to the fourth length L4 may be less than or equal to about ½. For example, the conductive filler 220 may be provided such that a ratio of the third length L3 to the fourth length L4 may be at least about ⅕ and no greater than about ½. The third length L3 may be a vertical length of the solder bump 222, such that the size of the solder bump 222 may be excessively large when a ratio of the third length L3 to the fourth length L4 is large. Thus, the conductive filler 220 may be provided such that the third length L3 may be less than the fourth length L4.

The first width W1 may be equal to or greater than the second width W2. In a manufacturing process for the semiconductor package according to an embodiment to be described below, the first post 211 may be formed before the second post 212, and the second post 212 may be formed on one cross-section of the first post 211. The support post 210 may be provided such that the first width W1 and the second width W2 are equal to each other. However, as an error may occur in the manufacturing process, the support post 210 may be provided such that the second width W2 is less than the first width W1. As a result, a center line of a position where the second post 212 is provided may not be equally aligned with the first post 211, and the second post 212 may be formed misaligned in the horizontal direction due to the error in the manufacturing process. When the second width W2 is less than the first width W1, the second post 212 may be provided on one cross-section of the first post 211 even when the second post 212 is formed misaligned with the first post 211 in the horizontal direction.

A perimeter of the second post 212 may be within a perimeter of the first post 211.

As the first width W1 is greater than the second width W2, an area of the perimeter of the first post 211 may be greater than an area of the perimeter of the second post 212.

The first width W1 and the third width W3 may be equal to or different from each other. In an example embodiment, the first post 211 and the lower filler 221 may be formed in the same process in the semiconductor package manufacturing process to be described later, such that the first width W1 and the third width W3 may be equal to each other for convenience of the process.

Figure 4:
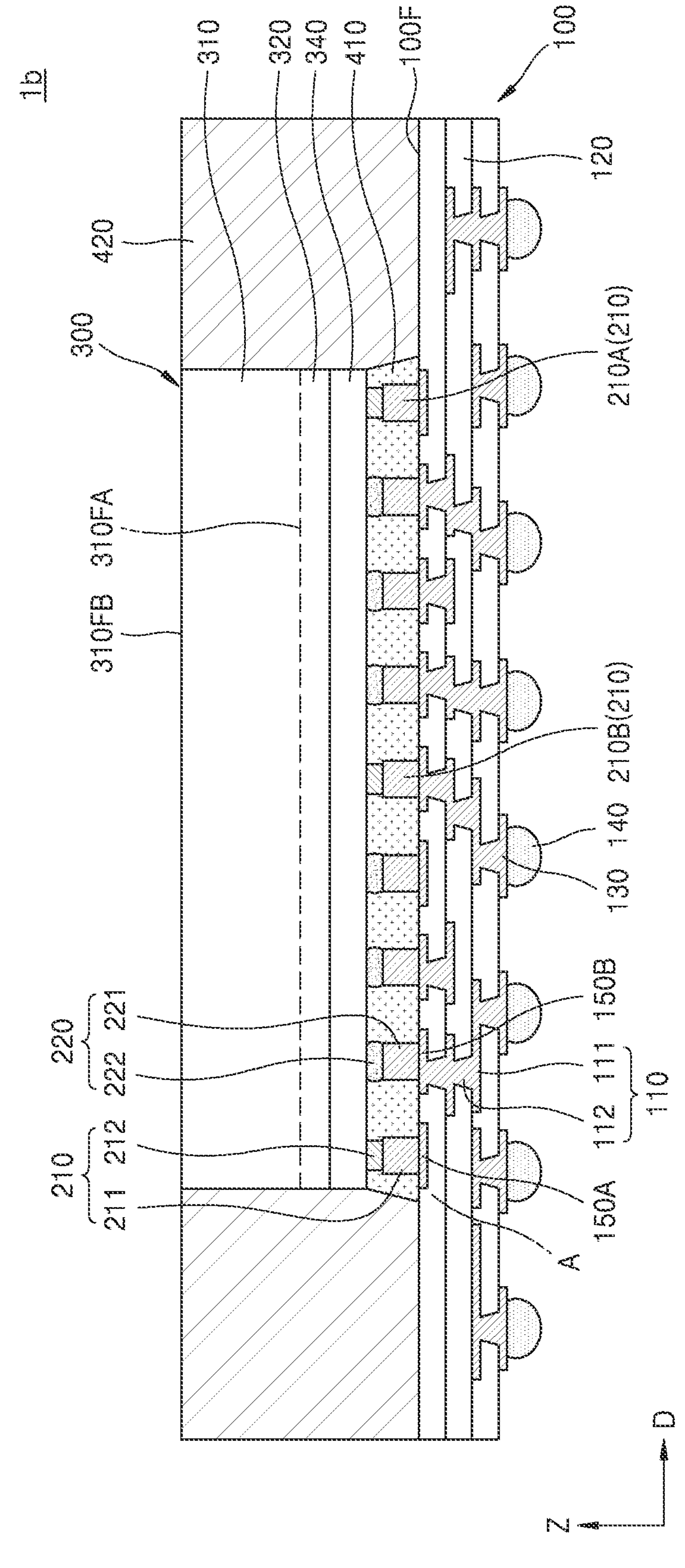
FIG. 4 is a diagram of a semiconductor package, according to an embodiment.
Figure 5A:
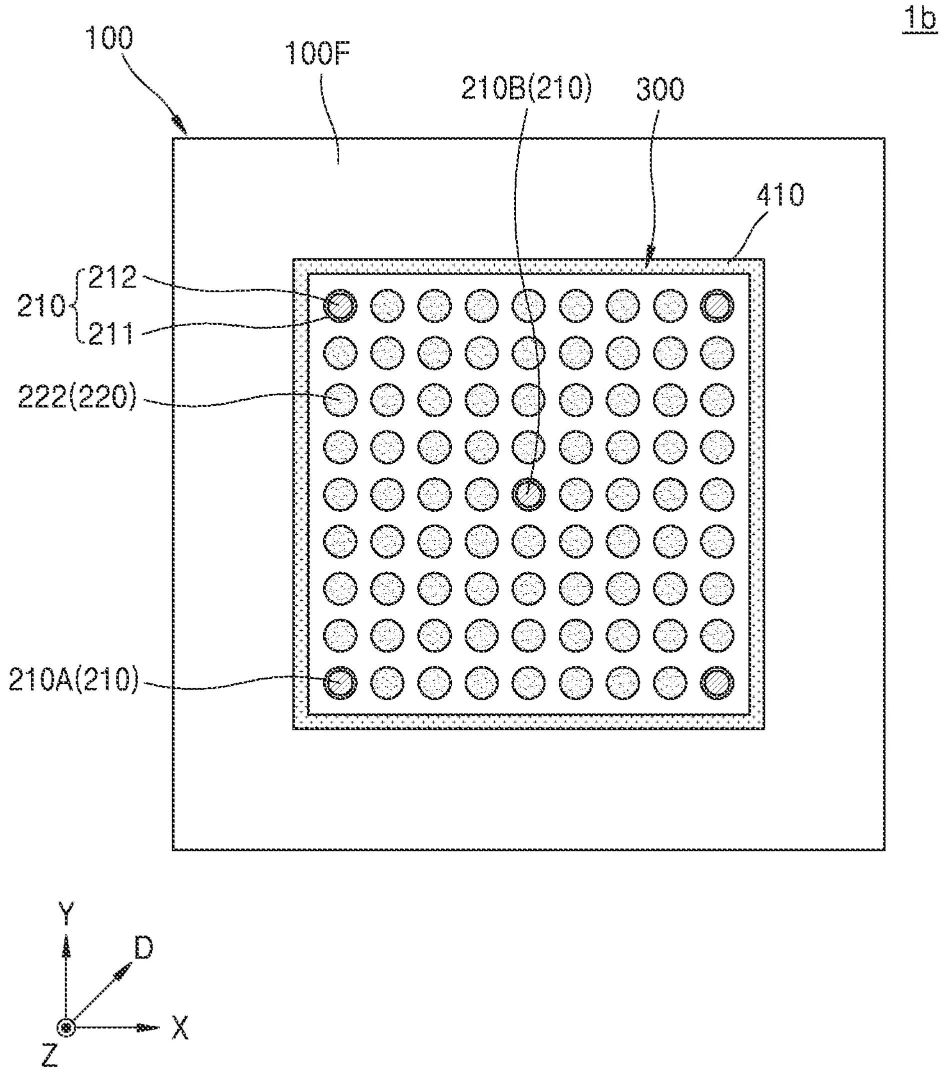
FIG. 5A is a diagram of a semiconductor package, according to an embodiment.
Figure 5B:
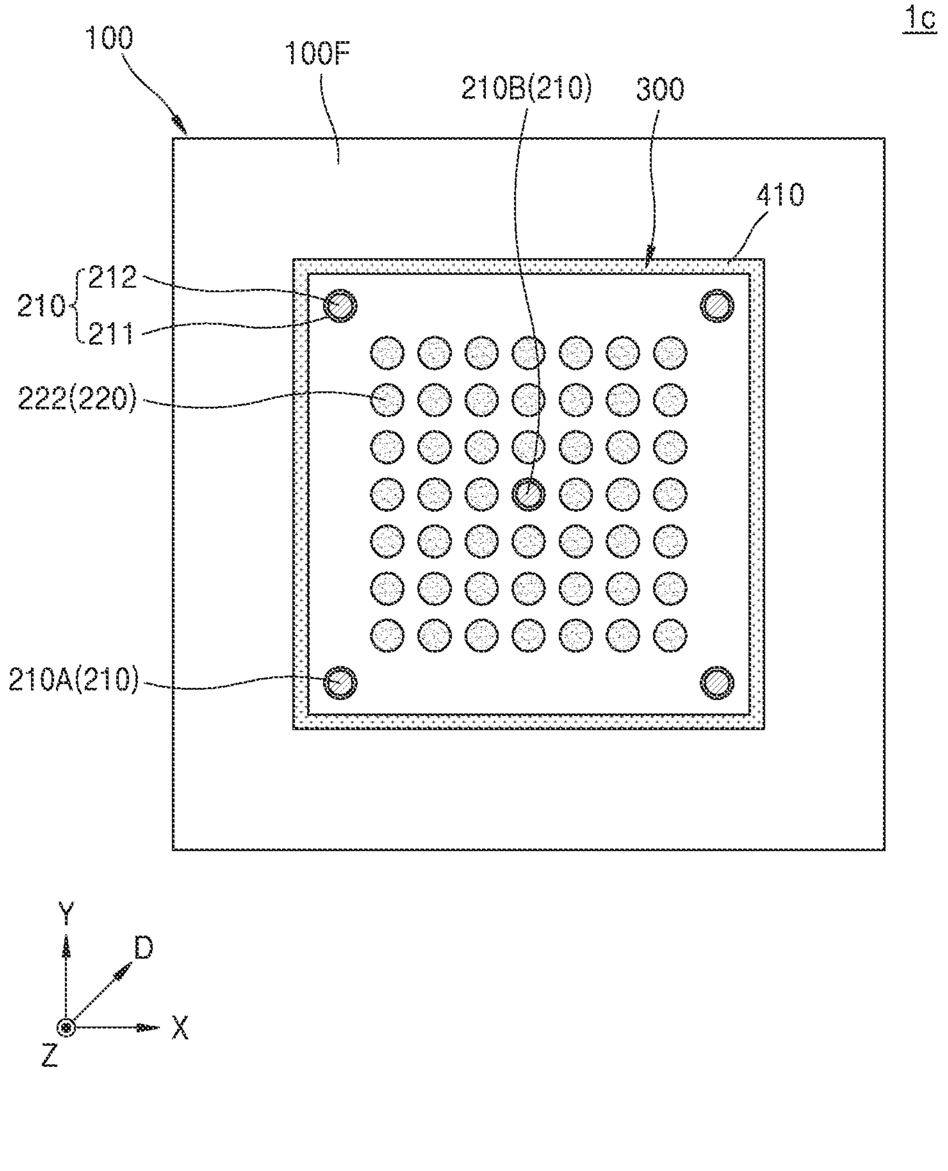
FIG. 5B is a diagram of a semiconductor package, according to an embodiment.

FIG. 4 is a diagram of a semiconductor package 1*b*, according to an embodiment. FIG. 5A is a diagram of a semiconductor package 1*b*, according to an embodiment. FIG. 5B is a diagram of a semiconductor package 1*c*, according to an embodiment. FIGS. 4-5B may include features similar to those described above, and repeated descriptions may be omitted.

Referring to FIGS. 4 and 5A, the semiconductor package 1*b* according to an embodiment may include a support post 210A located inside a vertex provided by connecting corners formed by the perimeter of the semiconductor chip 300, and a support post 210B provided in a center portion of the semiconductor chip 300. As used herein, a vertex" may refer to a location that corresponds to an area where sides, lines, edges, etc., of a configuration meet. For example, in FIG. 5A, the support post 210 may be located at an area that corresponds to an upper left vertex of the square-like configuration of the posts/fillers. That is, an upper left vertex of the semiconductor chip 300. The vertices referred to herein may also be referred to as corners.

Referring to FIG. 5B, the semiconductor package 1*c* according to an embodiment may include the support post 210A inside the vertex provided by connecting the corners formed by the perimeter of the semiconductor chip 300. The conductive filler 220 may not be provided between the support post 210A and another support post 210A in the X-axis or Y-axis direction. In other words, the conductive filler 220 may be provided in the semiconductor package 1*c* so as to be closer to the inner side from the semiconductor chip 300 than the support post 210A formed inside the corners formed by the perimeter of the semiconductor chip 300. The semiconductor package 1*c* may include the support post 210B provided in the center portion of the semiconductor chip 300.

Due to warpage inherent in the semiconductor chip and the redistribution structure, when a distance between the center portion of the semiconductor chip and the center portion of the redistribution structure is shorter than a distance between other parts of the semiconductor chip and the redistribution structure than the center portions, voids may occur in the underfill layer and a bonding failure may occur in the semiconductor chip.

Like in the semiconductor packages 1*b* and 1*c* according to an embodiment, when the support post 210B is provided in the center portions of the semiconductor chip 300 and the redistribution structure 100, a distance between the semiconductor chip 300 and the redistribution structure 100 in the vertical direction (the Z-axis direction) may be secured uniform. Thus, a failure of the semiconductor package due to the void of the underfill layer, the bonding failure of the semiconductor chip, etc., may be reduced. That is, a production yield of the semiconductor package may be improved.

Figure 6:
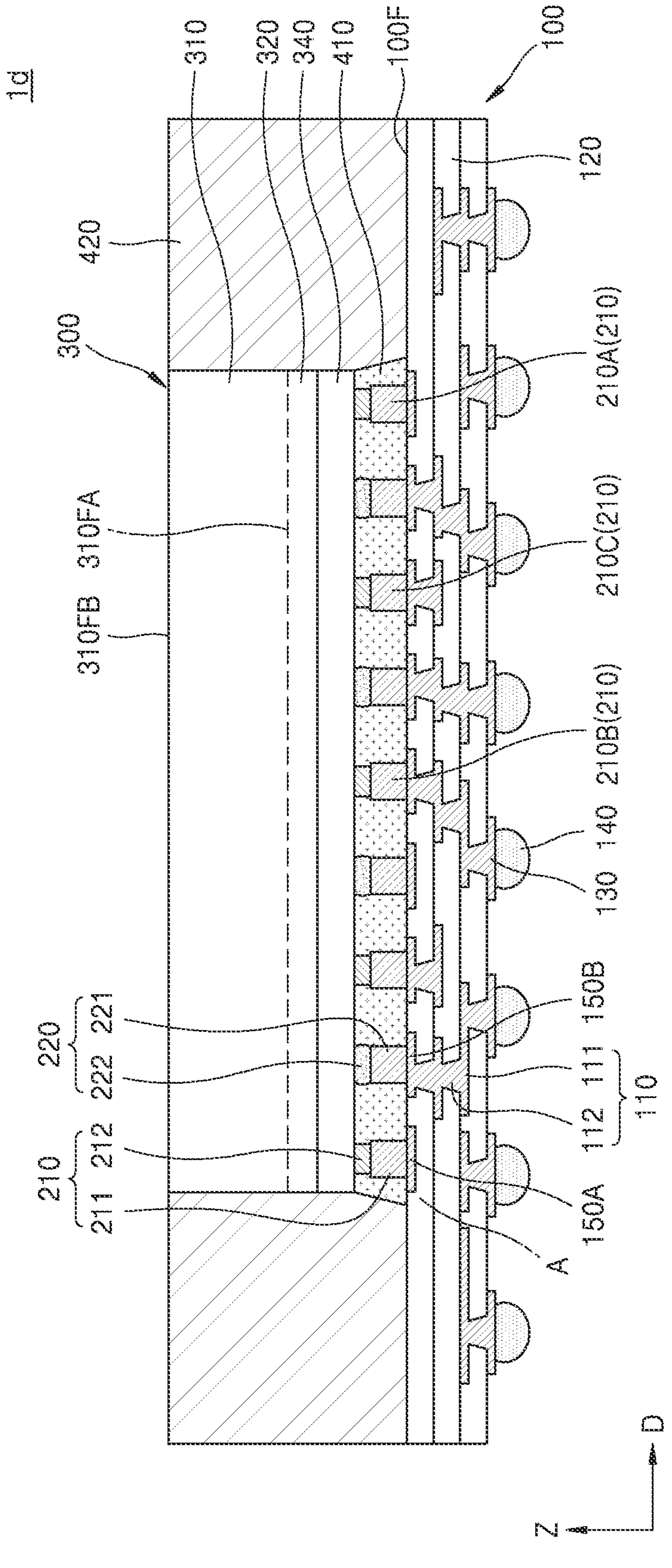
FIG. 6 is a diagram of a semiconductor package, according to an embodiment.
Figure 7A:
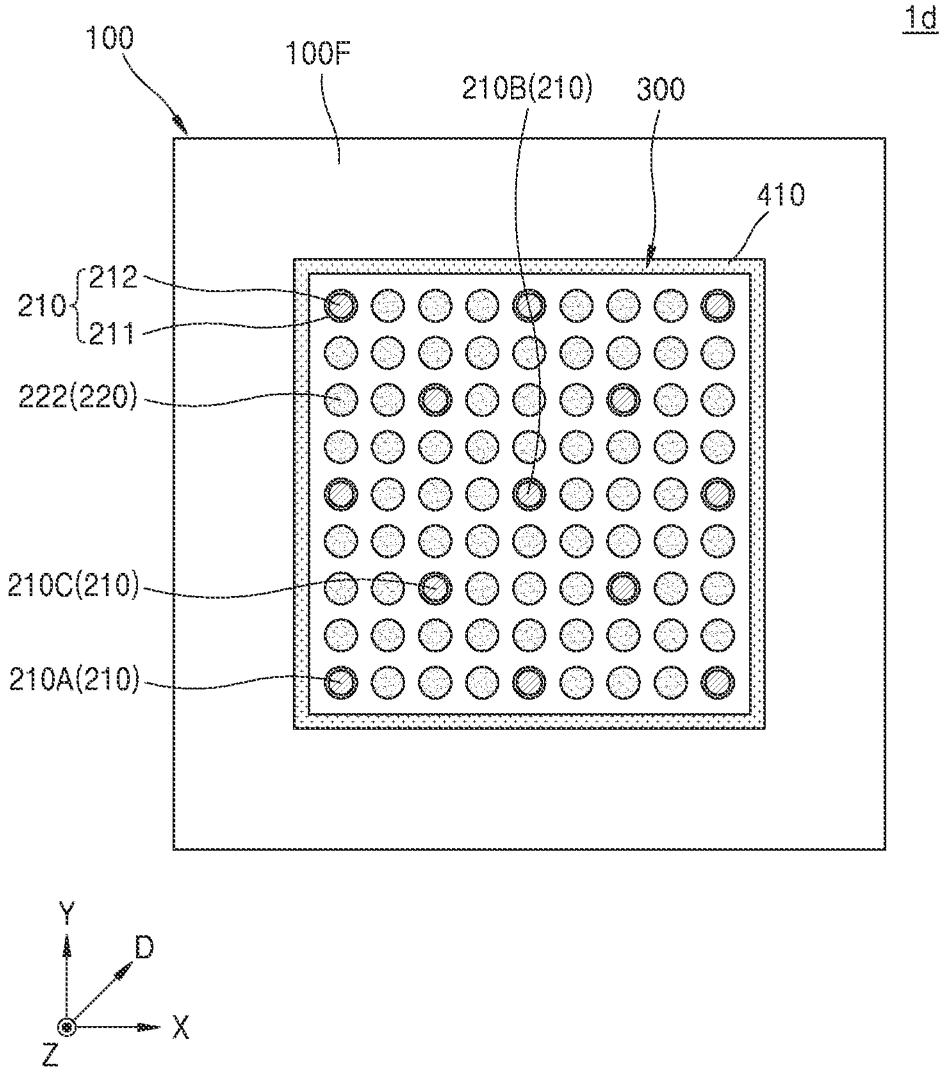
FIG. 7A is a diagram of a semiconductor package, according to an embodiment.
Figure 7B:
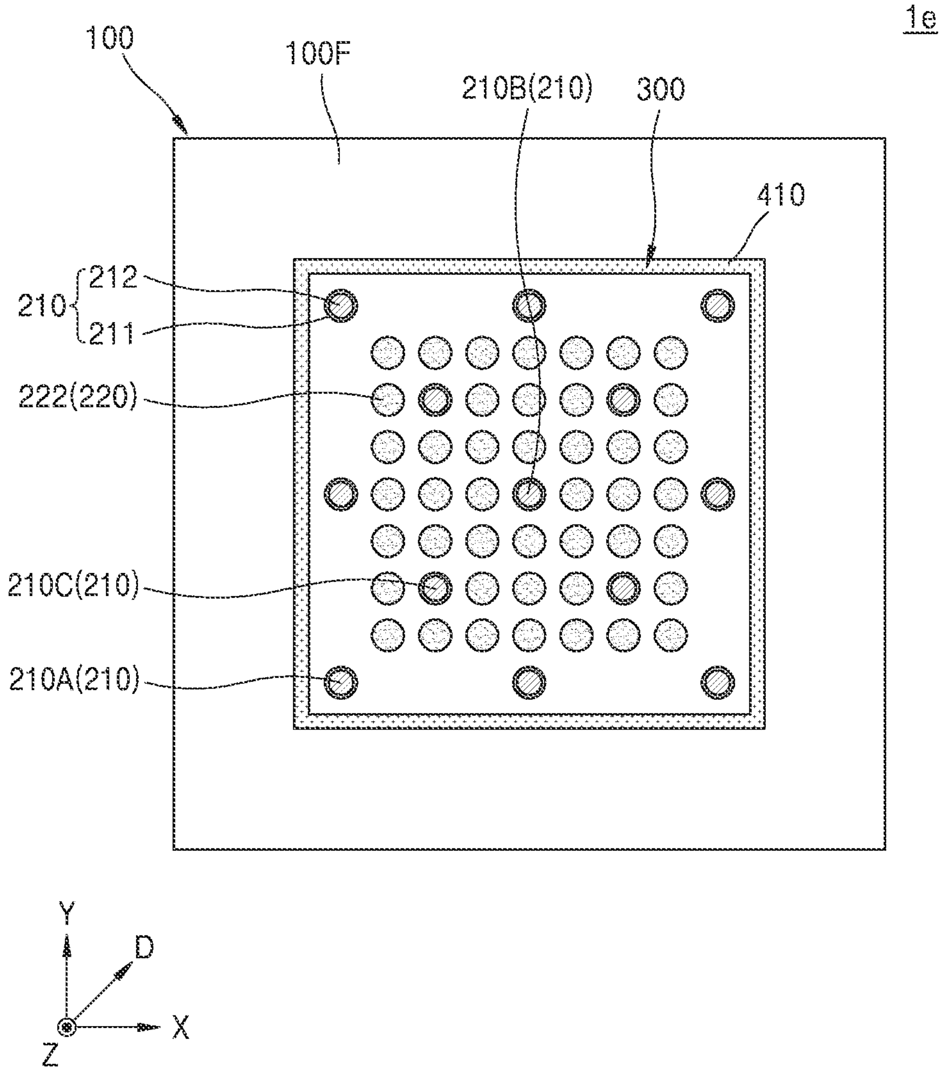
FIG. 7B is a diagram of a semiconductor package, according to an embodiment.

FIG. 6 is a diagram of a semiconductor package 1*d*, according to an embodiment. FIG. 7A is a diagram of the semiconductor package 1*d*, according to an embodiment. FIG. 7B is a diagram of a semiconductor package 1*e*, according to an embodiment. FIGS. 6-7B may include features similar to those described above, and repeated descriptions may be omitted.

Referring to FIGS. 6 and 7A, the semiconductor package 1*d* according to an embodiment may include the support post 210A located inside the corners (e.g., the vertices) formed by the perimeter of the semiconductor chip 300, the support post 210B provided in the center portion of the semiconductor chip 300, and a support post 210C provided between the support post 210A and the support post 210B.

Referring to FIG. 7B, the semiconductor package 1*e* according to an embodiment may include the support post 210A inside the corners formed by the perimeter of the semiconductor chip 300. The semiconductor package 1*e* may include the support post 210B provided in the center portion of the semiconductor chip 300. The conductive filler 220 may not be provided between the support post 210A and another support post 210A in the X-axis or Y-axis direction. In other words, the conductive filler 220 may be provided in the semiconductor package 1*e* so as to be closer to the inner side from the semiconductor chip 300 than the support post 210A formed inside the corners formed by the perimeter of the semiconductor chip 300. The semiconductor package 1*e* may include the support post 210C between the support post 210A and the support post 210B.

Due to warpage inherent in the semiconductor chip and the redistribution structure, when a distance between the center portion of the semiconductor chip and the center portion of the redistribution structure is shorter than a distance between other parts of the semiconductor chip and the redistribution structure than the center portions, void may occur in the underfill layer and a bonding failure may occur in the semiconductor chip.

Like in the semiconductor packages 1*d* and 1*e* according to an embodiment, when the support post 210B and the support post 210C are provided in the center portions of the semiconductor chip 300 and the redistribution structure 100, a distance between the semiconductor chip 300 and the redistribution structure 100 in the vertical direction (the Z-axis direction) may be secured uniform. Thus, a failure of the semiconductor package due to the void of the underfill layer, the bonding failure of the semiconductor chip, etc., may be reduced. That is, a production yield of the semiconductor package may be improved.

Figure 8:
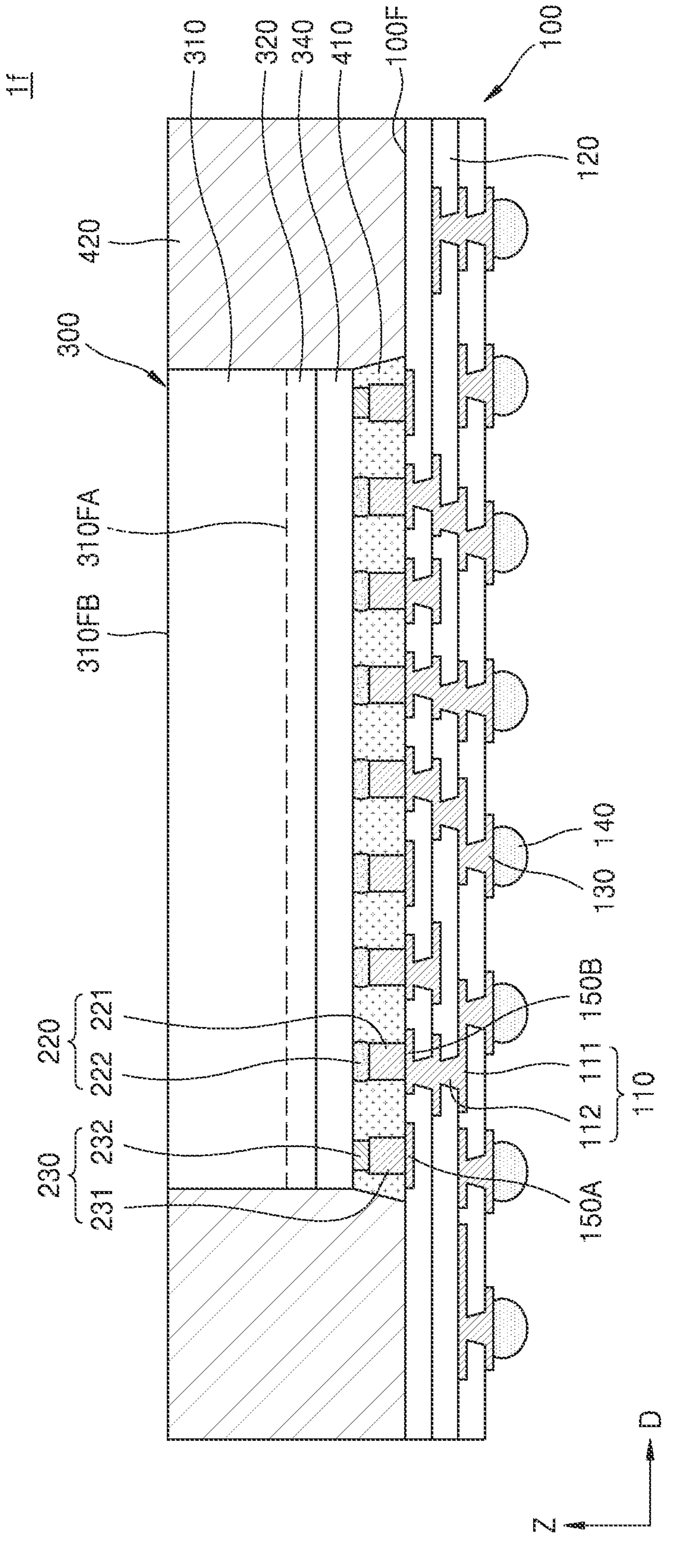
FIG. 8 is a diagram of a semiconductor package, according to an embodiment.
Figure 9:
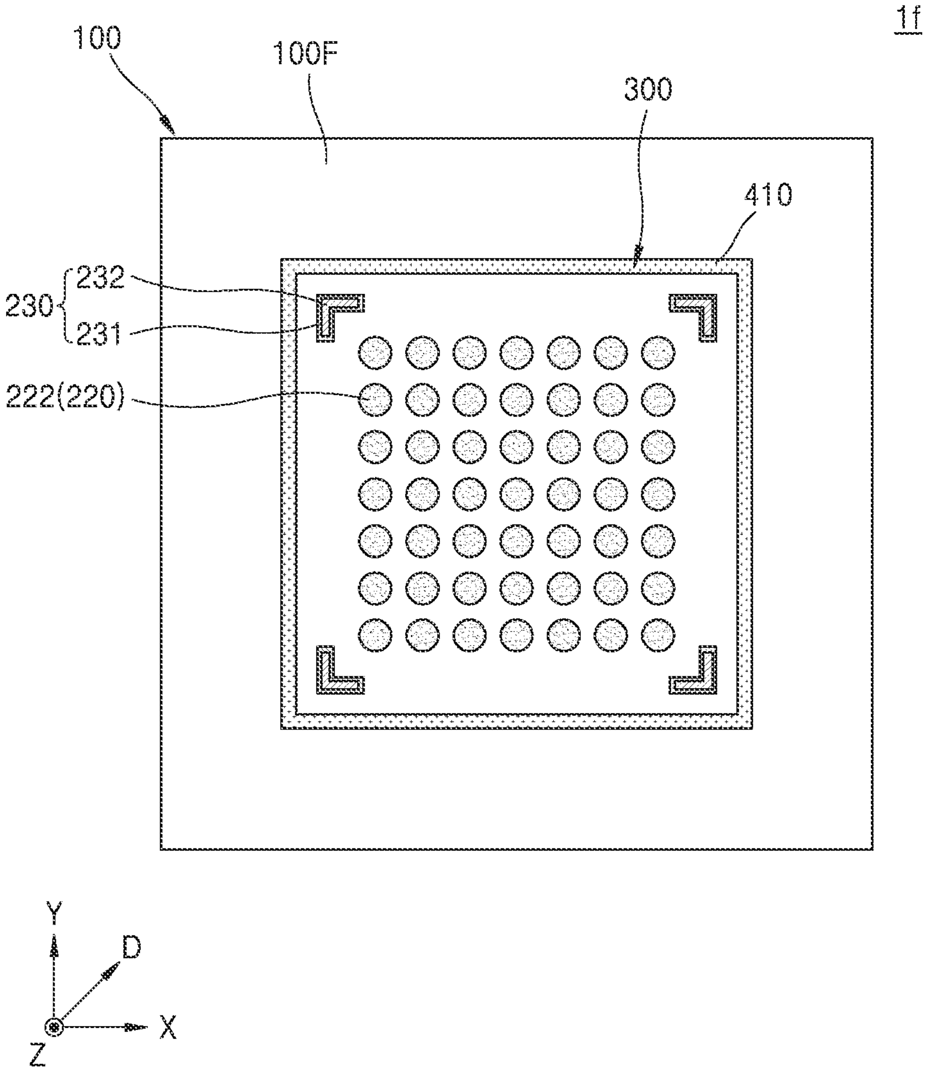
FIG. 9 is a diagram of a semiconductor package, according to an embodiment.

FIG. 8 is a side view of a semiconductor package 1*f*, according to an embodiment. FIG. 9 is a plan view of the semiconductor package 1*f*, according to an embodiment. FIGS. 8-9 may include features similar to those described above, and repeated descriptions may be omitted.

Referring to FIGS. 8 and 9, a support post 230 may include a first post 231 and a second post 232. A perimeter of the support post 230 may define an 'L' shape with respect to the X-Y plane. That is, the planar shape of the first post 231 and the planar shape of the second post 232 both may be 'L' shapes.

As shown in FIG. 9, a perimeter of the first post 231 may include a perimeter of the second post 232 (i.e., the perimeter of the second post 232 may be within the perimeter of the first post 231). That is, a perimeter of the shape of the first post 231 may different from a perimeter of the shape of the second post 232. For example, as shown in FIG. 9, the first post 231 may have a perimeter that forms a first 'L' shape, and the second post 232 may have a perimeter that forms a second 'L' shape that is within the first 'L' shape of the first post 231. Furthermore, a horizontal cross-sectional area of the first post may be greater than or equal to a horizontal cross-sectional area of the second post 232 that is within the perimeter of the first post 231.

The support post 230 may be arranged such that a portion protruding outward from a bent portion of the 'L' shape that is the planar shape of the support post 230 is oriented toward a vertex provided by the corners formed by the edges/sides perimeter of the semiconductor chip 300 meeting each other.

When the planar shape of the support post 230 is provided as the 'L' shape, the support post 230 may support a space between the semiconductor chip 300 and the redistribution structure 100 in two directions (the X-axis and Y-axis directions) as shown in FIG. 9. Thus, a failure of the semiconductor package due to the void of the underfill layer, the bonding failure of the semiconductor chip, etc., may be reduced. That is, a production yield of the semiconductor package may be improved.

FIGS. 10A, 10B, 10C, 10D, 10E and 10F are diagrams sequentially showing a manufacturing process for a semiconductor package, according to an embodiment. Hereinbelow, with reference to FIGS. 10A to 10F, a manufacturing method of the semiconductor package 1 according to an embodiment illustrated in FIG. 1 will be described.

Figure 10A:
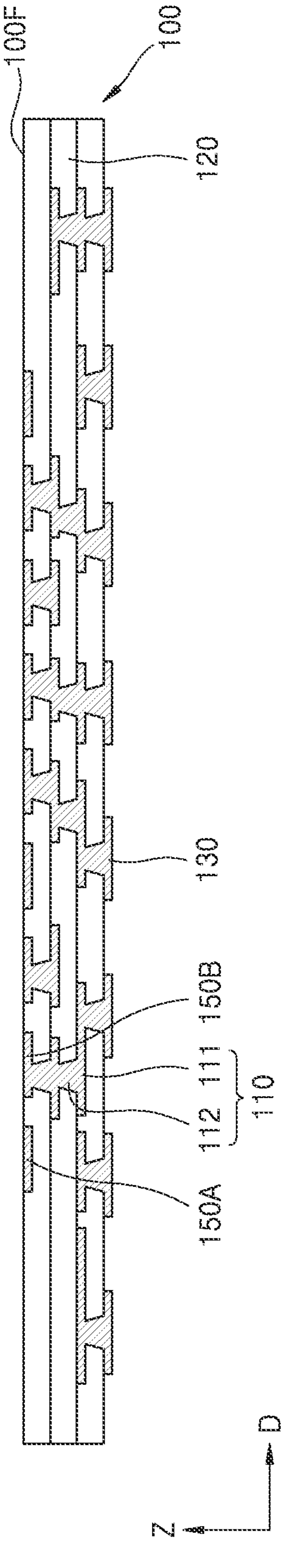
FIGS. 10A, 10B, 10C, 10D, 10E and 10F are diagrams sequentially showing a manufacturing process for a semiconductor package, according to an embodiment.

Referring to FIG. 10A, the redistribution structure 100 may be formed on a carrier substrate. The carrier substrate may include a second adhesive material layer like a releasing film on a surface thereof. The redistribution structure 100 may include the plurality of redistribution insulation layers 120 stacked sequentially on the carrier substrate, and the redistribution pattern 110 insulated by the plurality of redistribution insulation layers 120.

To form the redistribution structure 100, a first operation of forming a conductive material film on the carrier substrate and patterning the conductive material film to form the redistribution line pattern 111 of a first layer, a second operation of forming the redistribution insulation layer 120 having a via hole while covering the redistribution line pattern 111 of the first layer, and a third operation of forming the redistribution via pattern 112 filling the via hole of the redistribution insulation layer 120 and the redistribution line pattern 111 extending along a top surface of the redistribution insulation layer 120 may be performed, and then the second and third operations may be performed repeatedly several times.

Figure 10B:
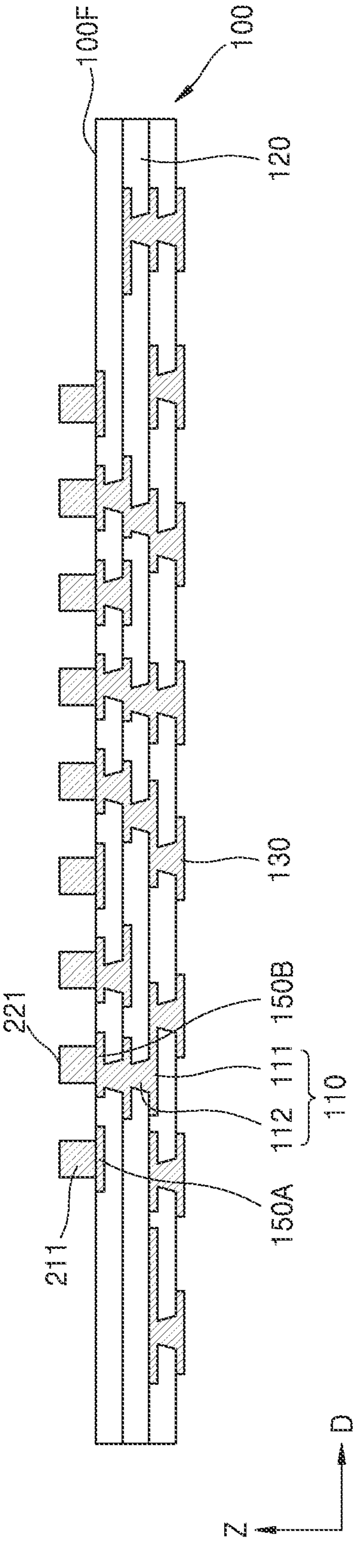

Referring to FIG. 10B, the first post 211 and the lower filler 221 may be formed through a photolithography process. A first photoresist may be formed on the redistribution structure 100. The first photoresist may include a photosensitive material including resin, solvent, a photo-active compound (PAC), a photo acid generator (PAG), an additive, etc. The photoresist may be exposed and developed, and the first post 211 and the lower filler 221 may be formed. In an example embodiment, the first post 211 and the lower filler 221 may be formed by electroplating. Thus, the first post 211 and the lower filler 221 may be formed in the same process, such that the first post 211 and the lower filler 221 may be formed of the same material.

Figure 10C:
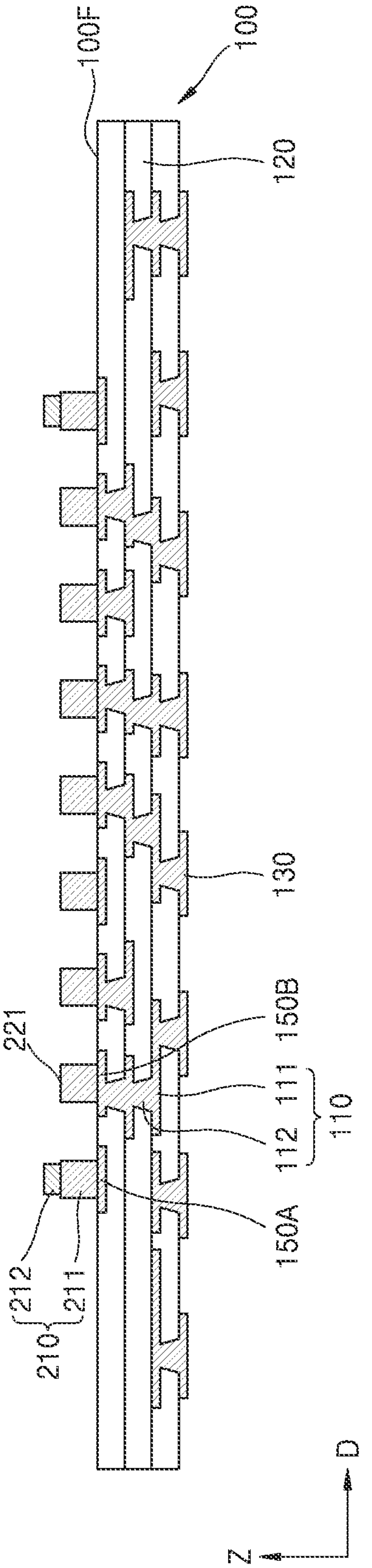

Referring to FIG. 10C, a second photoresist for forming the second post 212 may be formed. The second photoresist may include a photosensitive material including resin, solvent, a PAC, a PAG, an additive, etc. The second photoresist may be exposed and developed, and the second post 212 may be formed on the first post 211. In an example embodiment, the second post 212 may be formed by electroplating.

Figure 10D:
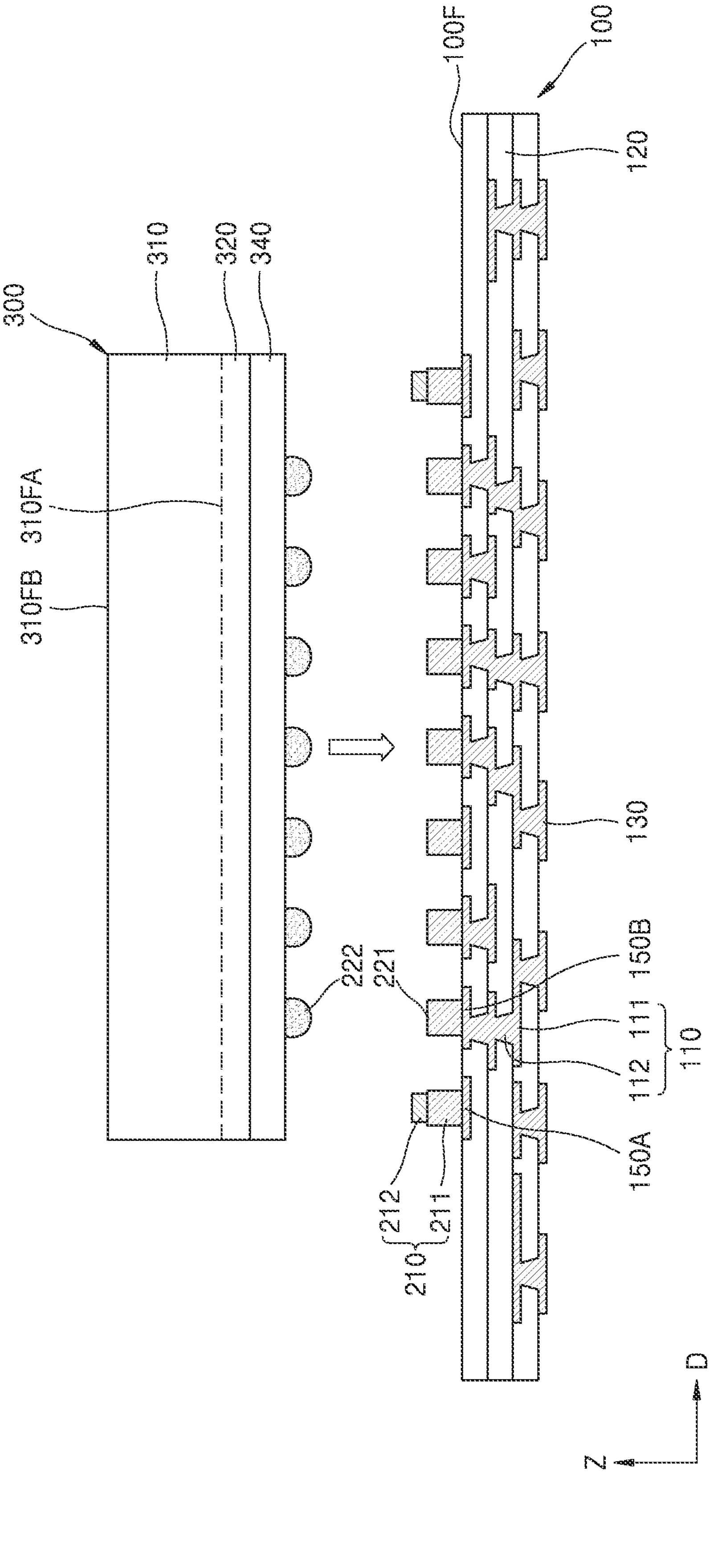

Referring to FIG. 10D, the semiconductor chip 300 including the solder bump 222 may be mounted on a resulting product of FIG. 10C. In an example embodiment, the semiconductor chip 300 may be mounted by thermal compression bonding. The solder bump 222 provided on a bottom surface of the semiconductor chip 300 may be melted and wet in an upper end of the lower filler 221. An upper end of the support post 210 may contact the semiconductor chip 300.

Figure 10E:
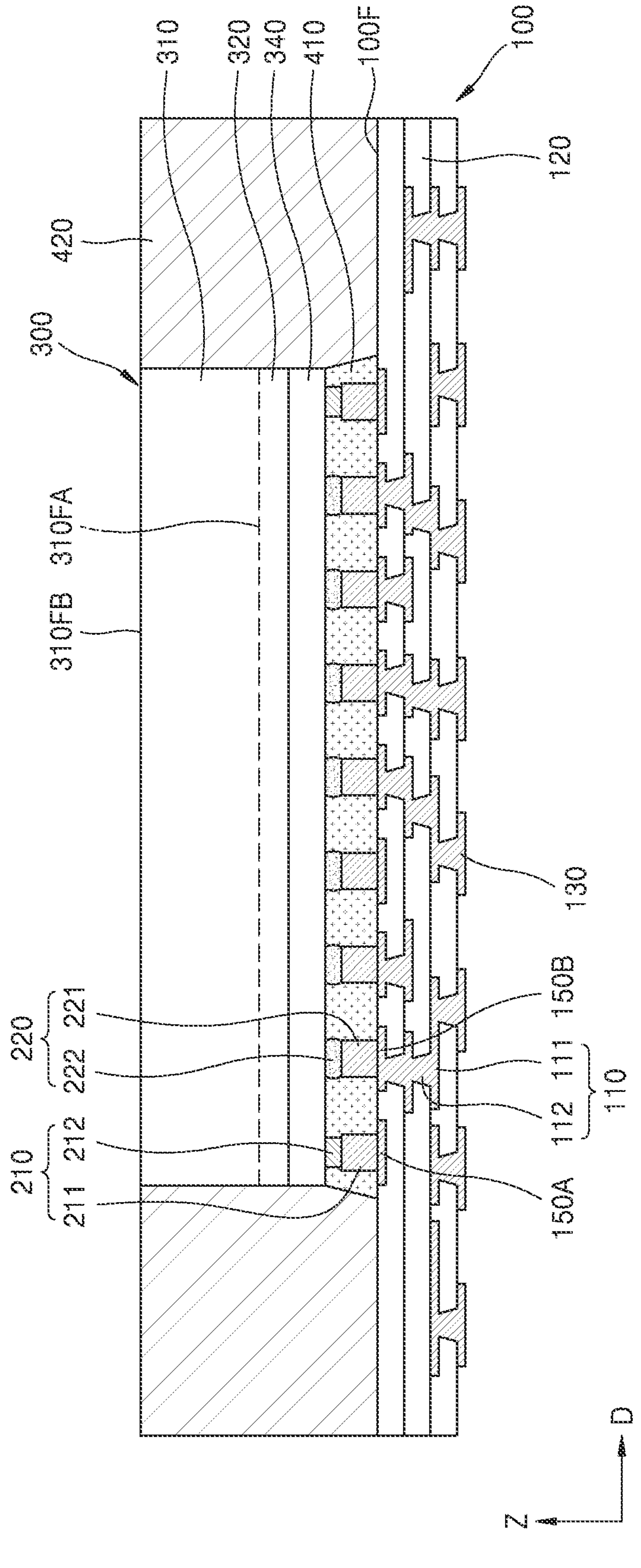

Referring to FIG. 10E, the semiconductor chip 300 may be mounted on the redistribution structure 100, and the underfill layer 410 may be filled in a space between the semiconductor chip 300 and the redistribution structure 100. The underfill layer 410 may be formed to surround side surfaces of the support post 210 and the conductive filler 220. In an example embodiment, the underfill layer 410 may be formed of a resin material formed using a capillary underfill method.

The molding layer 420 may be formed to surround the side surface of the semiconductor chip 300 and the side surface of the underfill layer 410. A side surface of the molding layer 420 may be formed to be coplanar with a side surface of the redistribution structure 100. The molding layer 420 may be formed to cover the top surface of the semiconductor chip 300. In an example embodiment, the top surface of the semiconductor chip 300 and the molding layer 420 covering the top surface of the semiconductor chip 300 may be partially removed using chemical mechanical polishing (CMP). Through CMP, the inactive surface 310FB that is the top surface of the semiconductor chip 300 may be provided.

Figure 10F:
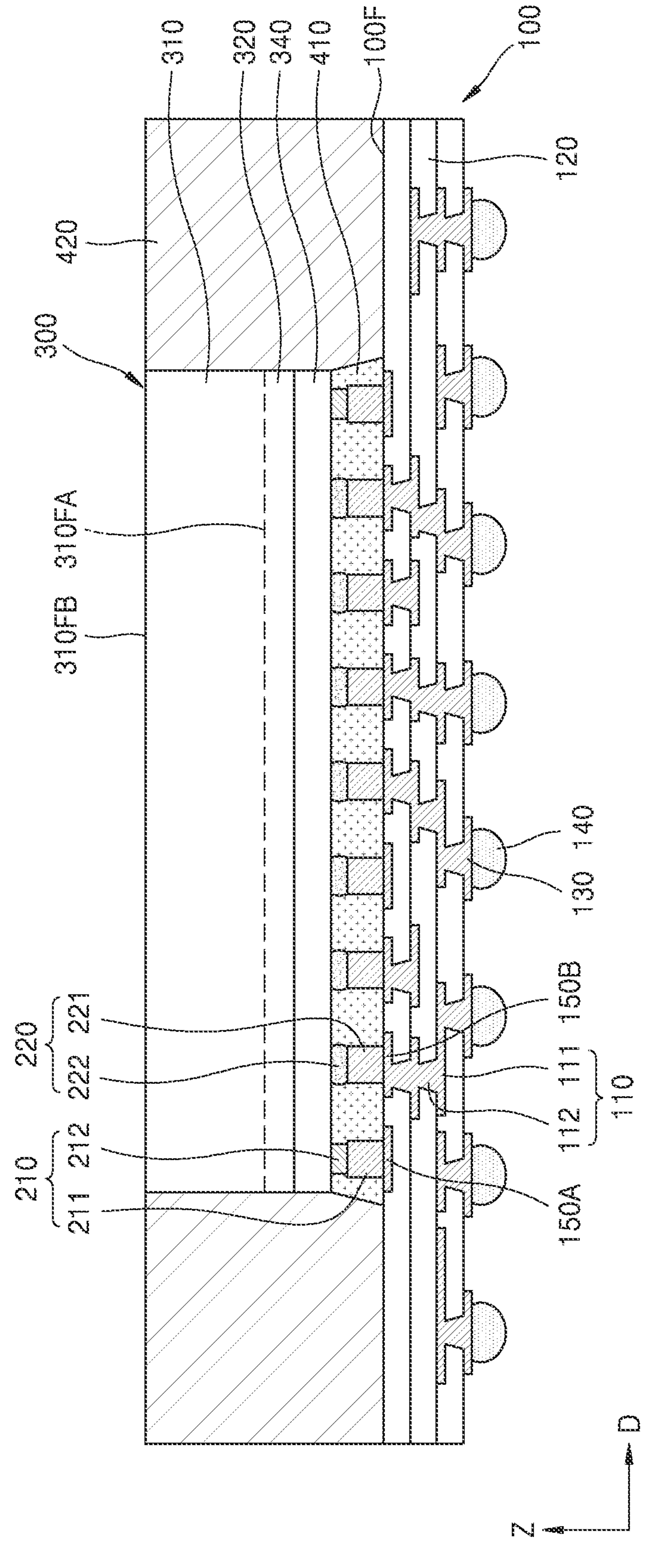

Referring to FIG. 10F, the carrier substrate supporting the redistribution structure 100 may be removed. A resulting product may be turned upside down to form the external connection terminal 140 on the lower connection pad 130.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A semiconductor package comprising:
- a redistribution structure;
- a semiconductor chip on the redistribution structure;
- a conductive filler between the redistribution structure and the semiconductor chip and electrically connecting the redistribution structure to the semiconductor chip;
- a support post between the redistribution structure and the semiconductor chip, the support post being spaced apart from the conductive filler, wherein the support post comprises:
  - a first post on a top surface of the redistribution structure; and
  - a second post comprising:
    - a first end connected to the first post; and
    - a second end oriented toward the semiconductor chip and supporting the semiconductor chip; and
- a passivation layer on a bottom surface of the semiconductor chip opposing the top surface of the redistribution structure, the passivation layer comprising a chip pad that directly contacts a solder bump of the conductive filler,
- wherein the second post directly contacts a bottom surface of the passivation layer, and
- wherein a vertical length of the conductive filler is the same as a vertical length of the support post.

2. The semiconductor package of claim 1, wherein the conductive filler comprises:
- a lower filler connected to the redistribution structure; and
- wherein the solder bump is in one end of the lower filler and electrically connecting connects the semiconductor chip to the lower filler.

3. The semiconductor package of claim 2, wherein the redistribution structure comprises a plurality of upper connection pads, wherein the plurality of upper connection pads is on a surface of the redistribution structure on which the semiconductor chip is located, and wherein at least one of the plurality of upper connection pads is directly in contact with the lower filler, and at least one of the plurality of upper connection pads is directly in contact with the first post.

4. The semiconductor package of claim 3, wherein the second post is insulated from the semiconductor chip by the passivation layer.

5. The semiconductor package of claim 4, wherein a first vertical length of the first post is equal to or greater than a second vertical length of the second post.

6. The semiconductor package of claim 5, wherein a ratio of the second vertical length to the first vertical length is at least about 1/5 and no greater than about 1/2.

7. The semiconductor package of claim 5, wherein a third vertical length of the solder bump is equal to the second vertical length.

8. The semiconductor package of claim 7, wherein a fourth vertical length of the lower filler is equal to the first vertical length.

9. The semiconductor package of claim 8, wherein a first horizontal width of the first post is equal to or greater than a second horizontal width of the second post.

10. The semiconductor package of claim 8, wherein a horizontal cross-sectional area of the first post is equal to or greater than a horizontal cross-sectional area of the second post.

11. The semiconductor package of claim 8, wherein a perimeter of the second post is within a perimeter of the first post.

12. The semiconductor package of claim 9, wherein the first post and the second post comprise the same material.

13. The semiconductor package of claim 12, wherein the first post and the second post comprise copper (Cu).

14. The semiconductor package of claim 9, wherein the first post and the lower filler comprise the same material.

15. The semiconductor package of claim 9, wherein the semiconductor chip has a rectangular shape, wherein the semiconductor package comprises a plurality of support posts, including the support post, and wherein each of the plurality of support posts is respectively provided at each vertex of the rectangular shape of the semiconductor chip.

16. The semiconductor package of claim 1, wherein the second post is in a center of the bottom surface of the semiconductor chip.

17. A semiconductor package comprising:

a redistribution structure comprising a top surface and a connection pad on the top surface;

a semiconductor chip on the redistribution structure, the semiconductor chip comprising a bottom surface and a passivation layer on the bottom surface opposing the top surface of the redistribution structure;

a conductive filler comprising:

a lower filler between the redistribution structure and the semiconductor chip, and connected to the connection pad; and a solder bump at one end of the lower filler and electrically connecting the semiconductor chip to the lower filler; and a support post comprising:

a first post between the redistribution structure and the semiconductor chip, the first post being separated from the conductive filler, and a second post comprising:

a first end connected to the first post; and a second end oriented toward the semiconductor chip and supporting the semiconductor chip, wherein the passivation layer comprises a chip pad that directly contacts the solder bump, wherein the second post is insulated from the semiconductor chip by the passivation layer, wherein a first vertical length of the first post is equal to or greater than a second vertical length of the second post, wherein a perimeter of the second post is within a perimeter of the first post, wherein the second post directly contacts a bottom surface of the passivation layer, and wherein a vertical length of the conductive filler is the same as a vertical length of the support post.

18. The semiconductor package of claim 17, wherein the semiconductor chip has a rectangular shape, wherein the semiconductor package further comprises a plurality of support posts including the support post, and wherein the plurality of support posts comprises:

a plurality of first support posts located at each vertex of the semiconductor chip, at least one second support post located at a center of the bottom surface of the semiconductor chip, and at least one third post located between at least one of the plurality of first support posts and the at least one second support post.

19. The semiconductor package of claim 17, wherein the first post, the second post, and the lower filler comprise the same material, and wherein each of the first post, the second post, and the lower filler comprises copper (Cu).

20. A semiconductor package comprising:

a redistribution structure comprising a top surface and a connection pad on the top surface;

a semiconductor chip on the redistribution structure, the semiconductor chip comprising a bottom surface and a passivation layer on the bottom surface opposing the top surface of the redistribution structure;

a conductive filler comprising:

a lower filler between the redistribution structure and the semiconductor chip, and electrically connected to the connection pad; and a solder bump at one end of the lower filler and electrically connecting the semiconductor chip to the lower filler; and a support post comprising:

a first post between the redistribution structure and the semiconductor chip, the first post being separated from the conductive filler; and a second post comprising:

a first end connected to the first post; and a second end oriented toward the semiconductor chip and supporting the semiconductor chip, wherein the second post is insulated from the semiconductor chip by the passivation layer, wherein a ratio of a second vertical length of the second post to a first vertical length of the first post is between about 1/5 and about 1/2, wherein a third vertical length of the solder bump is equal to the second vertical length, wherein a fourth vertical length of the lower filler is equal to the first vertical length, wherein a first horizontal width of the first post is equal to or greater than a second horizontal width of the second post, wherein a perimeter of the second post is within a perimeter of the first post, wherein the first post and the lower filler comprise the same material, wherein the second post directly contacts a bottom surface of the passivation layer, and wherein a vertical length of the conductive filler is the same as a vertical length of the support post.

* * * * *